(12) United States Patent
Lee et al.

(10) Patent No.: US 12,461,445 B2
(45) Date of Patent: Nov. 4, 2025

(54) LOW REFLECTIVITY PHOTOSENSITIVE RESIN COMPOSITION AND LIGHT-SHIELDING LAYER USING SAME

(71) Applicant: DUK SAN NEOLUX CO., LTD., Cheonan-si (KR)

(72) Inventors: Changmin Lee, Cheonan-si (KR); Yun Jong Ko, Cheonan-si (KR); Jun Bae, Cheonan-si (KR); Jun Ki Kim, Cheonan-si (KR); Hyunsang Cho, Cheonan-si (KR); Soung Yun Mun, Cheonan-si (KR)

(73) Assignee: DUK SAN NEOLUX CO., LTD., Cheonan-si (KR)

( * ) Notice: Subject to any disclaimer, the term of this patent is extended or adjusted under 35 U.S.C. 154(b) by 468 days.

(21) Appl. No.: 18/040,184

(22) PCT Filed: Jun. 3, 2021

(86) PCT No.: PCT/KR2021/006929
§ 371 (c)(1),
(2) Date: Feb. 1, 2023

(87) PCT Pub. No.: WO2022/039356
PCT Pub. Date: Feb. 24, 2022

(65) Prior Publication Data
US 2023/0273517 A1 Aug. 31, 2023

(30) Foreign Application Priority Data
Aug. 21, 2020 (KR) .................. 10-2020-0105309

(51) Int. Cl.
*G03F 7/105* (2006.01)
*G03F 7/004* (2006.01)
*G03F 7/031* (2006.01)
*G03F 7/033* (2006.01)
*H10K 59/80* (2023.01)

(52) U.S. Cl.
CPC ............ *G03F 7/105* (2013.01); *G03F 7/0042* (2013.01); *G03F 7/0045* (2013.01); *G03F 7/031* (2013.01); *G03F 7/033* (2013.01); *H10K 59/8792* (2023.02); *H10K 59/80* (2023.02)

(58) Field of Classification Search
CPC ...... G03F 7/105; G03F 7/0042; G03F 7/0045; G03F 7/031; G03F 7/033; G03F 7/0007; G03F 7/0388; G03F 7/029; G03F 7/032; H10K 59/8792; H10K 59/122
See application file for complete search history.

(56) References Cited

U.S. PATENT DOCUMENTS 12,019,373 B2   6/2024 Lee et al.
2020/0241415 A1* 7/2020 Lee .................... C08G 59/245

FOREIGN PATENT DOCUMENTS

| KR | 10-2015-0103704 A | 9/2015 |
| KR | 10-2018-0009270 A | 1/2018 |
| KR | 10-2018-0010040 A | 1/2018 |
| KR | 10-2019-0042922 A | 4/2019 |
| KR | 10-2020-0064274 A | 6/2020 |

OTHER PUBLICATIONS

Martim et al., "A urethane-based multimethacrylate mixture and its use in dental composites with combined high-performance properties", Dental Materials, 2014, vol. 30, Issue 2, pp. 155-163.

* cited by examiner

*Primary Examiner* — Stewart A Fraser
(74) *Attorney, Agent, or Firm* — Vorys, Sater, Seymour and Pease LLP; Mih Suhn Koh

(57) ABSTRACT

According to one embodiment of the present disclosure, a photosensitive resin composition comprising a resin containing a repeating unit represented by Chemical Formula (1), a dye represented by Chemical Formula (2), a reactive unsaturated compound, a pigment, an initiator, and a solvent, and a display device comprising a pattern layer containing a polymerization reaction product of the photosensitive resin composition are provided.

18 Claims, No Drawings

LOW REFLECTIVITY PHOTOSENSITIVE RESIN COMPOSITION AND LIGHT-SHIELDING LAYER USING SAME

TECHNICAL FIELD

The present disclosure relates to a photosensitive resin composition that effectively lowers reflectivity by comprising a dye in addition to the previously used black and black combination pigments, and a colored light-shielding layer using the same.

BACKGROUND ART

A liquid crystal display device (LCD), an organic light emitting display device (OLED), etc. are widely used in flat panel display devices. Among them, the organic light emitting display device in particular has advantages such as low power consumption, fast response speed, high color reproducibility, high luminance, and wide viewing angle.

In the case of the organic light emitting display device, a polarizing film is used to block the light when external light is incident and is reflected from the panel. There is a disadvantage that the polarizing film is not suitable for application to a flexible device due to a lack of bending properties.

As a method for solving the above problem, methods such as a method of forming an inorganic film for blocking light on an upper substrate as well as a color filter and a black matrix have been proposed. However, the method has a limit in obtaining a desired level of anti-reflection effect, and does not specifically suggest a method for replacing the polarizing film.

Meanwhile, a colored light-shielding layer, particularly a black light-shielding layer, is used in order to increase image quality by preventing color interference between red, green, and blue color filters in liquid crystal display devices, and the use of the colored light-shielding layer has recently been studied even in organic light emitting displays in order to increase image visibility with the same purpose and low reflectivity.

Carbon black and organic pigments are used as black colorants when the light-shielding layer is manufactured, and since they are dispersed and applied, the pigment dispersion is mixed with other compositions to form a pattern.

At this time, various types of black or a combination of pigments capable of representing black are used, and research is needed to be able to effectively lower the reflectivity at a wavelength of around 550 nm, which has the most influence on visibility.

(Patent Document 1) Korean Patent No. 10-1141566

DISCLOSURE

Technical Problem

An object of the present disclosure is to provide a photosensitive resin composition capable of improving visibility by lowering the reflectivity at a wavelength of 550 nm.

Another object of the present disclosure is to provide a light-shielding layer manufactured using the photosensitive resin composition and a display device including the light-shielding layer.

Technical Solution

A photosensitive resin composition according to one embodiment of the present disclosure comprises:
a binder resin containing a repeating unit represented by the following Chemical Formula (1);
a dye represented by the following Chemical Formula (2);
a pigment;
a reactive unsaturated compound;
a photoinitiator; and
a solvent:

Chemical Formula (1)

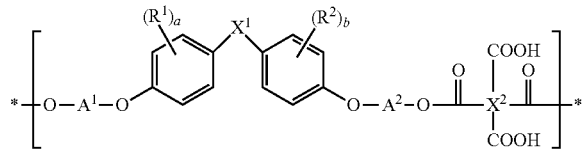

In Chemical Formula (1),
1) * indicates a part where bonds are connected as a repeating unit,
2) $R^1$ and $R^2$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
3) $R^1$ and $R^2$ are each capable of forming a ring with an adjacent group,
4) a and b are each independently an integer of 0 to 4,
5) $X^1$ is a single bond, O, CO, $SO_2$, CR'R'', SiR'R'', Chemical Formula (A), or Chemical Formula (B),
6) $X^2$ is a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; or combinations thereof,
7) R' and R'' are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
8) R' and R'' are each capable of forming a ring with an adjacent group,
9) $A^1$ and $A^2$ are each independently Chemical Formula (C) or Chemical Formula (D),
10) the ratio of Chemical Formula (C) to Chemical Formula (D) within the polymer chain of the resin containing the repeating unit represented by Chemical Formula (1) satisfies 1:9 to 9:1, Chemical Formula (A)

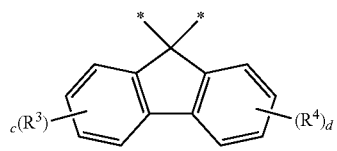

-continued

Chemical Formula (B)

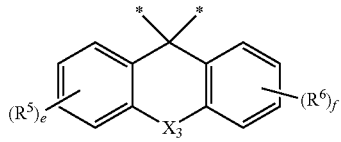

In Chemical Formulas (A) and (B), 11-1) * indicates a binding position, 11-2) $X_3$ is O, S, $SO_2$, or NR', 11-3) R' is hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 11-4) $R^3$ to $R^6$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 11-5) $R^3$ to $R^6$ are each capable of forming a ring with an adjacent group, and 11-6) c to f are each independently an integer of 0 to 4, Chemical Formula (C)

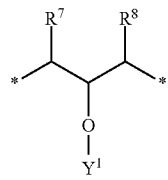

Chemical Formula (D)

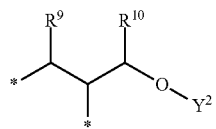

In Chemical Formulas (C) and (D), 12-1) * indicates a binding position, 12-2) $R^7$ to $R^{10}$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, and 12-3) $Y^1$ and $Y^2$ are Chemical Formula (E), Chemical Formula (E)

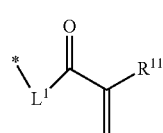

In Chemical Formula (E), 13-1) * indicates a binding position, 13-2) R" is hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 13-3) $L^1$ is a single bond, $C_1$-$C_{30}$ alkylene, $C_6$-$C_{30}$ arylene, or $C_2$-$C_{30}$ heterocycle, 14) $R^1$ to $R^{11}$, R', R", $X^1$ to $X^2$ and $L^1$, and a ring formed by bonding adjacent groups to each other may be each further substituted with one or more substituents selected from the group consisting of: deuterium; a halogen; a silane group substituted or unsubstituted with a $C_1$-$C_{30}$ alkyl group or a $C_6$-$C_{30}$ aryl group; a siloxane group; a boron group; a germanium group; a cyano group; an amino group; a nitro group; a $C_1$-$C_{30}$ alkylthio group; a $C_1$-$C_{30}$ alkoxy group; a $C_6$-$C_{30}$ arylalkoxy group; a $C_1$-$C_{30}$ alkyl group; a $C_2$-$C_{30}$ alkenyl group; a $C_2$-$C_{30}$ alkynyl group; a $C_6$-$C_{30}$ aryl group; a $C_6$-$C_{30}$ aryl group substituted with deuterium; a fluorenyl group; a $C_2$-$C_{30}$ heterocyclic group containing at least one heteroatom selected from the group consisting of O, N, S, Si, and P; a $C_3$-$C_{30}$ aliphatic cyclic group; a $C_7$-$C_{30}$ arylalkyl group; a $C_8$-$C_{30}$ arylalkenyl group; and combinations thereof, and adjacent substituents may form a ring, Chemical Formula (2)

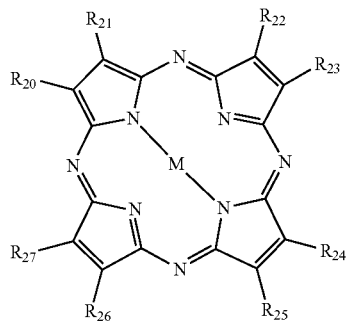

In Chemical Formula (2), 15-1) M is Zn, Cu, Ti, Fe, V=O (vanadium oxide), Ni, Mn, or Co;

15-2) $R_{20}$ to $R_{27}$ are each independently hydrogen; deuterium; halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 15-3) $R_{20}$ to $R_{27}$ are each capable of forming a ring with an adjacent group, and 16) The rings formed by bonding $R_{20}$ to $R_{27}$ and neighboring groups to each other may be each further substituted with one or more substituents selected from the group consisting of: deuterium; halogen; a silane group substituted or unsubstituted with a $C_1$-$C_{30}$ alkyl group or a $C_6$-$C_{30}$ aryl group; a siloxane group; a boron group; a germanium group; a cyano group; an amino group; a nitro group; a $C_1$-$C_{30}$ alkylthio group; a $C_1$-$C_{30}$ alkoxy group; a $C_6$-$C_{30}$ arylalkoxy group; a $C_1$-$C_{30}$ alkyl group; a $C_2$-$C_{30}$ alkenyl group; a $C_2$-$C_{30}$ alkynyl group; a $C_6$-$C_{30}$ aryl group; a $C_6$-$C_{30}$ aryl group substituted with deuterium; a fluorenyl group; a $C_2$-$C_{30}$ heterocyclic group containing at least one heteroatom selected from the group consisting of O, N, S, Si, and P; a $C_3$-$C_{30}$ aliphatic ring; a $C_7$-$C_{30}$ arylalkyl group; a $C_5$-$C_{30}$ arylalkenyl group; and combinations thereof, and adjacent substituents may form a ring.

Preferably, $X^1$ of Chemical Formula 1 in the photosensitive resin composition is Chemical Formula (A) or Chemical Formula (B), or more preferably Chemical Formula (A).

Further, the maximum absorption wavelength of the dye represented by Chemical Formula (2) above is preferably included in a region of 500 nm to 620 nm.

Further, it is preferable that the cured film formed of the photosensitive resin composition has an optical density of 1 or more per 1 μm of film thickness at a wavelength of 550 nm and a reflectivity of 9% or less per 1 μm of film thickness at a wavelength of 550 nm.

Further, the binder resin containing a repeating unit represented by Chemical Formula (1) above preferably has a weight average molecular weight of 1,000 to 50,000 g/mol.

Further, the photosensitive resin composition may preferably comprise: 1 to 30% by weight of the resin containing the repeating unit represented by Chemical Formula (1) above; 0.1 to 10% by weight of the dye represented by Chemical Formula (2) above; 1 to 30% by weight of the pigment; 1 to 40% by weight of the reactive unsaturated compound; 0.01 to 10% by weight of the photoinitiator; and the balance of the solvent.

Furthermore, a pattern layer according to the present disclosure preferably contains a polymerization reaction product of the photosensitive resin composition.

Further, it is preferable that the pattern layer is a light-shielding layer.

Further, it is preferable that the pattern layer is a pixel defining layer that separates a plurality of sub-pixels.

Further, the sub-pixel preferably includes a light emitting device therein, and more preferably, includes an organic light emitting device therein.

Furthermore, a display device according to the present disclosure preferably includes the pattern layer.

Furthermore, an electronic device according to the present disclosure preferably includes the display device and a controller for driving the display device.

Advantageous Effects

In the photosensitive resin composition according to one embodiment of the present disclosure, a polymer containing the repeating unit represented by Chemical Formula (1) has a relatively nonlinear structure compared to a polymer including only one of the structure of Chemical Formula (C) or the structure of Chemical Formula (D) by including Chemical Formula (C) and Chemical Formula (D) at a ratio of 1:9 to 9:1. Accordingly, the polymer containing the repeating unit of Chemical Formula (1) exhibits a high optical density and a low reflectivity since it has the dye well-adsorbed therein even after undergoing the exposure step and the development step compared to the polymer including only one of the structure of Chemical Formula (C) or the structure of Chemical Formula (D).

Further, the photosensitive resin composition according to the present disclosure comprises the dye represented by Chemical Formula (2) above in addition to the black pigment. The dye represented by Chemical Formula (2) above has the maximum absorption wavelength at 500 nm to 620 nm, and can effectively lower the reflectivity around 550 nm, which has the greatest effect on visibility.

Due to this, it is possible to improve the visibility of the display device using the photosensitive resin composition according to the present disclosure.

BEST MODE FOR IMPLEMENTATION OF THE INVENTION

The photosensitive resin composition according to one embodiment of the present disclosure comprises: a binder resin containing a repeating unit represented by the following Chemical Formula (1); a dye represented by the following Chemical Formula (2); a pigment; a reactive unsaturated compound; a photoinitiator; and a solvent:

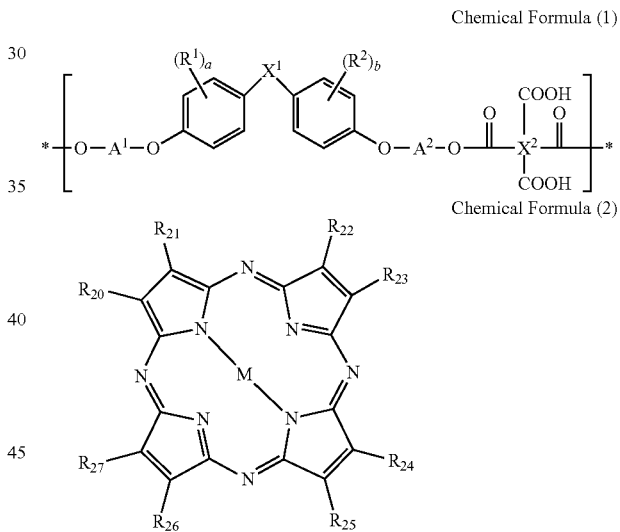

Chemical Formula (1)

Chemical Formula (2)

Mode for Implementation of the Invention

In describing the present disclosure, if it is determined that a detailed description of a related known configuration or function may obscure the gist of the present disclosure, the detailed description may be omitted. When "includes", "has", "consisting of", etc. mentioned in the present specification are used, other parts may be added unless "only" is used. When an element is expressed in a singular form, it may include a case in which the plural form is included unless otherwise explicitly stated.

Further, in describing the elements of the present disclosure, terms such as first, second, A, B, (a), (b), etc. may be used. These terms are only for distinguishing the elements from other elements, and the essence, order, sequence, or number of the corresponding elements is not limited by the terms.

In the description of the positional relationship of elements, when two or more elements are described as being "linked", "coupled" or "connected", two or more elements may be directly "linked", "coupled" or "connected", but it should be understood that two or more elements and other elements may be further "interposed" to be also "linked," "coupled," or "connected." Here, other elements may be included in one or more of two or more elements that are "linked", "coupled" or "connected" to each other.

Further, when an element such as a layer, film, region, plate, or the like is said to be "over" or "on" another element, it should be understood that this not only includes a case where an element is "directly above" another element, but also includes a case where another element is in the middle thereof. Conversely, it should be understood that, when an element is said to be "directly above" another part, it means that there is no other part in the middle thereof.

In the description of the temporal flow relation related to the elements, the operation method, the manufacturing method, etc., for example, when a temporal precedence relationship or a flow precedence relationship such as "after", "subsequently", "then", "before", or the like is described, it may also include a case where it is not continuous unless "immediately" or "directly" is used.

Meanwhile, when numerical values or correspondence information for elements are mentioned, even if there is no separate explicit description, the numerical values or the correspondence information may be interpreted as including a possible error range caused by various factors (e.g., process factors, internal or external impact, noise, etc.).

The terms used in the present specification and the appended scope of claims are as follows, unless otherwise stated, within a range that does not depart from the spirit of the present disclosure.

The term "halo" or "halogen" used in the present application includes fluorine (F), chlorine (Cl), bromine (Br), and iodine (I), unless otherwise specified.

The term "alkyl" or "alkyl group" used in the present application, unless otherwise stated, has 1 to 60 carbons linked by a single bond, and means radicals of saturated aliphatic functional groups including a straight chain alkyl group, a branched chain alkyl group, a cycloalkyl (alicyclic) group, an alkyl-substituted cycloalkyl group, and a cycloalkyl-substituted alkyl group.

The term "haloalkyl group" or "halogen alkyl group" used in the present application refers to an alkyl group in which a halogen is substituted unless otherwise stated.

Although, unless otherwise stated, the term "alkenyl" or "alkynyl" used in the present application each has a double bond or a triple bond, includes a straight or branched chain group, and has 2 to 60 carbon atoms, the present disclosure is not limited thereto.

Although the term "cycloalkyl" used in the present application refers to an alkyl forming a ring having 3 to 60 carbon atoms unless otherwise stated, the present disclosure is not limited thereto.

Although the term "alkoxy group" or "alkyloxy group" used in the present application refers to an alkyl group to which an oxygen radical is bonded, and has 1 to 60 carbon atoms unless otherwise stated, the present disclosure is not limited thereto.

Although the term "alkenoxyl group", "alkenoxy group", "alkenyloxyl group", or "alkenyloxy group" used in the present application refers to an alkenyl group to which an oxygen radical is attached, and has 2 to 60 carbon atoms unless otherwise stated, the present disclosure is not limited thereto.

Although the terms "aryl group" and "arylene group" used in the present application each have 6 to 60 carbon atoms unless otherwise stated, the present disclosure is not limited thereto. In the present application, the aryl group or the arylene group includes single ring types, ring assemblies, fused multiple ring-based compounds, etc. For example, the aryl group may include a phenyl group, a monovalent functional group of biphenyl, a monovalent functional group of naphthalene, a fluorenyl group, and a substituted fluorenyl group, and the arylene group may include a fluorenylene group and a substituted fluorenylene group.

The term "ring assemblies" used in the present application means that two or more ring systems (single ring or fused ring systems) are directly connected to each other through a single bond or a double bond, and the number of direct links between such rings is one less than the total number of ring systems in the compound. In the ring assemblies, the same or different ring systems may be directly linked to each other through a single or double bond.

Since the aryl group in the present application includes ring assemblies, the aryl group includes biphenyl and terphenyl in which benzene rings that are single aromatic rings are connected by a single bond. Further, since the aryl group also includes compounds in which an aromatic single ring and a fused aromatic ring system are connected by a single bond, for example, compounds to which a fluorene, an aromatic ring system fused with the benzene rings that are aromatic single rings, is connected by a single bond are also included.

The term "fused multiple ring systems" used in the present application means a fused ring form sharing at least two atoms, and includes a form in which ring systems of two or more hydrocarbons are fused, a form in which at least one heterocyclic system including at least one heteroatom is fused, etc. Such fused multiple ring systems may be an aromatic ring, a heteroaromatic ring, an aliphatic ring, or combinations of these rings. For example, although the aryl group may be a naphthalenyl group, a phenanthrenyl group, a fluorenyl group, etc., the present disclosure is not limited thereto.

The term "spiro compound" used in the present application has a "spiro union", and the spiro union means a linkage formed by sharing only one atom by two rings. At this time, the atom shared by the two rings is called a "spiro atom", and they are called a "monospiro-compound", a "dispiro-compound", and a "trispiro-compound" respectively depending on the number of spiro atoms in a compound.

The terms "fluorenyl group", "fluorenylene group", and "fluorentriyl group" used in the present application each refer to a monovalent, divalent, or trivalent functional group in which R, R', R", and R'" are all hydrogen in the structure below unless otherwise stated, and "substituted fluorenyl group", "substituted fluorenylene group", or "substituted fluorentriyl group" means that at least one of substituents R, R', R", and R'" is a substituent other than hydrogen, and includes cases in which R and R' are bonded to each other to form a spiro compound together with the carbon to which they are bonded. In the present specification, the fluorenyl group, the fluorenylene group, and the fluorentriyl group may all be referred to as fluorene groups regardless of valences such as monovalent, divalent, trivalent, etc.

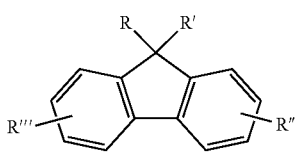

Further, R, R', R" and R'" may each independently be an alkyl group having 1 to 20 carbon atoms, an alkenyl group having 1 to 20 carbon atoms, an aryl group having 6 to 30 carbon atoms, or a heterocyclic group having 2 to 30 carbon atoms. For example, the aryl group may be phenyl, biphenyl, naphthalene, anthracene or phenanthrene, and the heterocyclic group may be pyrrole, furan, thiophene, pyrazole, imidazole, triazole, pyridine, pyrimidine, pyridazine, pyrazine, triazine, indole, benzofuran, quinazoline, or quinoxaline. For example, the substituted fluorenyl group and fluorenylene group may each be a monovalent or divalent functional group of 9,9-dimethylfluorene, 9,9-diphenylfluorene, and 9,9'-spirobi[9H-fluorene].

Although the term "heterocyclic group" used in the present application includes not only an aromatic ring such as "heteroaryl group" or "heteroarylene group", but also a non-aromatic ring, and it means a ring of 2 to 60 carbon atoms each containing one or more heteroatoms unless otherwise stated, the present disclosure is not limited thereto. The term "heteroatom" used in the present application refers to N, O, S, P, or Si unless otherwise stated, and the heterocyclic group means heteroatom-containing single ring types, ring assemblies, fused multiple ring systems, spiro compounds, etc.

For example, the "heterocyclic group" may also include a compound including a heteroatom group such as $SO_2$, $P{=}O$, or the like, such as the following compound instead of carbon forming a ring:

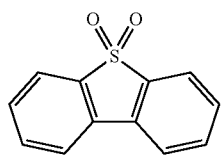 [SMILES: O=S1(=O)c2ccccc2-c2ccccc21]

The term "ring" used in the present application includes monocyclic and polycyclic rings, includes hydrocarbon rings as well as heterocycles containing at least one heteroatom, and includes aromatic and non-aromatic rings.

The term "polycyclic ring" used in the present application includes ring assemblies such as biphenyl, terphenyl, etc., fused multiple ring systems, and spiro compounds, includes not only an aromatic ring but also a non-aromatic ring, and includes hydrocarbon rings as well as heterocycles containing at least one heteroatom.

Although the term "aliphatic cyclic group" used in the present application refers to a cyclic hydrocarbon other than an aromatic hydrocarbon, includes single ring types, ring assemblies, fused multiple ring systems, spiro compounds, etc., and means a ring of 3 to 60 carbon atoms unless otherwise stated, the present disclosure is not limited thereto. For example, even when benzene, which is an aromatic ring, and cyclohexane, which is a non-aromatic ring, are fused, it corresponds to an aliphatic ring.

Further, when prefixes are named consecutively, it is meant that the substituents are listed in the order listed first. For example, an arylalkoxy group means an alkoxy group substituted with an aryl group, an alkoxycarbonyl group means a carbonyl group substituted with an alkoxy group, and an arylcarbonylalkenyl group means an alkenyl group substituted with an arylcarbonyl group, where the arylcarbonyl group is a carbonyl group substituted with an aryl group.

Further, although, unless otherwise explicitly stated, "substituted" in the term "substituted or unsubstituted" used in the present application means that it is substituted with one or more substituents selected from the group consisting of deuterium, a halogen, an amino group, a nitrile group, a nitro group, a $C_1$-$C_{20}$ alkyl group, a $C_1$-$C_{20}$ alkoxy group, a $C_1$-$C_{20}$ alkylamine group, a $C_1$-$C_{20}$ alkylthiophene group, a $C_6$-$C_{20}$ arylthiophene group, a $C_2$-$C_{20}$ alkenyl group, a $C_2$-$C_{20}$ alkynyl group, a $C_3$-$C_{20}$ cycloalkyl group, a $C_6$-$C_{20}$ aryl group, a $C_6$-$C_{20}$ aryl group substituted with deuterium, a $C_8$-$C_{20}$ arylalkenyl group, a silane group, a boron group, a germanium group, and a $C_2$-$C_{20}$ heterocyclic group containing at least one heteroatom selected from the group consisting of O, N, S, Si, and P, the present disclosure is not limited to these substituents.

In the present application, although the "functional group name" corresponding to the aryl group, arylene group, heterocyclic group, etc. exemplified as examples of each symbol and its substituents may be written as "the name of the functional group reflecting the valence", it may also be written as "the name of the parent compound". For example, in the case of "phenanthrene", which is a type of aryl group, although the name of the group may be written by dividing valences in such a manner that the monovalent "group" is divided into "phenanthryl (group)" and the divalent group is divided into "phenanthrylene (group)", it may also be written as "phenanthrene", which is the name of the parent compound, regardless of the valences.

Similarly, even in the case of pyrimidine, it may be written as "pyrimidine" regardless of the valences, or it may also be written in the "name of the group" of the corresponding valence in such a manner that it is written as pyrimidinyl (group) if it is monovalent and it is written as pyrimidinylene (group) if it is divalent. Therefore, when the type of the substituent is written as the name of the parent compound in the present application, it may mean an n-valent "group" formed by the detachment of a hydrogen atom bonding to a carbon atom and/or a hetero atom of the parent compound.

Further, numbers, alphabets, etc. indicating positions may be omitted in writing the compound name or the substituent name in the present specification. For example, pyrido[4,3-d]pyrimidine may be written as pyridopyrimidine, benzofuro[2,3-d]pyrimidine may be written as benzofuropyrimidine, and 9,9-dimethyl-9H-fluorene may be written as dimethylfluorene. Therefore, both benzo[g]quinoxaline and benzo[f]quinoxaline may be written as benzoquinoxaline.

Further, unless there is an explicit explanation, the Chemical Formulas used in the present application are equally applied as the definition of the substituent by the exponential definition of the following Chemical Formula:

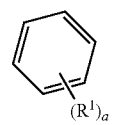

Here, when a is an integer of 0, it means that the substituent $R^1$ is absent, that is, when a is 0, it means that all hydrogens are bonded to carbons forming the benzene ring, and at this time, the display of the hydrogens bonded to the carbons is omitted, and the Chemical Formula or compound may be written. Further, one substituent $R^1$ may be bonded to any one of the carbons forming the benzene ring when a is an integer of 1, it may be bonded, for example, as follows, when a is an integer of 2 or 3, it is bonded to the carbons of the benzene ring in a similar manner even when a is an integer of 4 to 6, and $R^1$ may be the same as or different from each other when a is an integer of 2 or more.

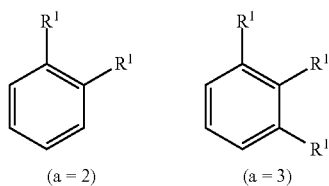

Unless otherwise stated in the present application, forming a ring means that adjacent groups are bonded to each other to form a single ring or fused multiple rings, and the formed single ring and fused multiple rings may include hydrocarbon rings as well as heterocycles containing at least one heteroatom, and may include aromatic and non-aromatic rings.

Further, unless otherwise stated in the present specification, when representing a condensed ring, the number in "number-condensed ring" indicates the number of rings to be condensed. For example, a form in which three rings such as anthracene, phenanthrene, benzoquinazoline, etc. are condensed with each other may be expressed as a 3-condensed ring.

Meanwhile, unless otherwise stated, the term "bridged bicyclic compound" used in the present application refers to a compound in which two rings share three or more atoms to form a ring. At this time, the shared atoms may include carbon or a heteroatom.

The organic electronic element in the present application may mean a component(s) between the anode and the cathode, or may mean an organic light emitting diode including the anode and the cathode, and the component(s) positioned therebetween.

Further, in some cases, the display device in the present application may mean an organic electronic element, an organic light emitting diode, and a panel including the same, or may also mean an electronic device including a panel and a circuit. Here, for example, although the electronic device may include all of a lighting device, a solar cell, a portable or mobile terminal (e.g., a smartphone, tablet, PDA, electronic dictionary, PMP, etc.), a navigation terminal, a game machine, various TVs, various computer monitors, etc., the present disclosure is not limited thereto, and it may be any type of device as long as it includes the component(s).

A photosensitive resin composition according to one embodiment of the present disclosure comprises a binder resin containing a repeating unit represented by Chemical Formula (1) below, a dye represented by Chemical Formula (2) below, a reactive unsaturated compound, a pigment, an initiator, and a solvent.

The resin containing the repeating unit of the structure of Chemical Formula (1) above includes structures represented by Chemical Formulas (C) and (D) below in a polymer chain. Specifically, the polymer containing the repeating unit represented by Chemical Formula (1) above includes Chemical Formula (C) and Chemical Formula (D) at the ratio of 1:9 to 9:1, thereby having a relatively nonlinear structure compared to the polymer including only one of the structure of Chemical Formula (C) above or the structure of Chemical Formula (D) above.

Accordingly, the polymer containing the repeating unit of Chemical Formula (1) exhibits a high optical density and a low reflectivity since it has the dye well-adsorbed therein even after undergoing the exposure step and the development step compared to the polymer including only one of the structure of Chemical Formula (C) or the structure of Chemical Formula (D).

Further, the photosensitive resin composition according to the present disclosure comprises the dye represented by Chemical Formula (2) above in addition to the black pigment. The dye represented by Chemical Formula (2) above has the maximum absorption wavelength at 500 nm to 620 nm, and can effectively lower the reflectivity around 550 nm, which has the greatest effect on visibility. Due to this, it is possible to improve the visibility of the display device using the photosensitive resin composition according to the present disclosure.

Hereinafter, embodiments of the present disclosure will be described in detail. However, this is presented as an example, and the present disclosure is not limited thereto, and the present disclosure is only defined by the scope of the claims to be described later. Hereinafter, respective components will be described in detail.

(A) Binder Resin

A binder resin according to one embodiment of the present disclosure contains a repeating unit having a structure as shown in Chemical Formula (1) below.

Chemical Formula (1)

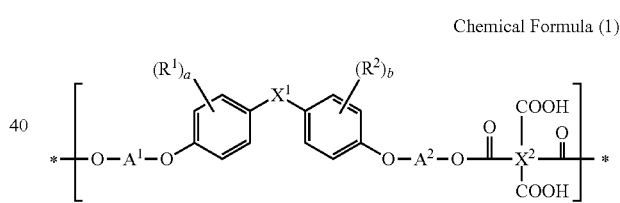

In Chemical Formula (1) above,
1) * indicates a part where bonds are connected as a repeating unit,
2) $R^1$ and $R^2$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
3) $R^1$ and $R^2$ are each capable of forming a ring with an adjacent group,
4) a and b are each independently an integer of 0 to 4,
5) $X^1$ is a single bond, O, CO, $SO_2$, CR'R'', SiR'R'', Chemical Formula (A), or Chemical Formula (B),
6) $X^2$ is a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; or combinations thereof, 7) R' and R" are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 8) R' and R" are each capable of forming a ring with an adjacent group, 9) $A^1$ and $A^2$ are each independently Chemical Formula (C) or Chemical Formula (D), and 10) the ratio of Chemical Formula (C) to Chemical Formula (D) within the polymer chain of the resin containing the repeating unit represented by Chemical Formula (1) satisfies 1:9 to 9:1.

Examples in which R' and R" combine with each other to form a ring are as follows.

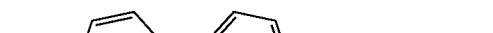

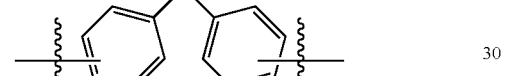

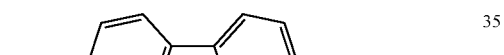

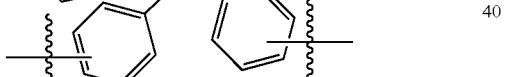

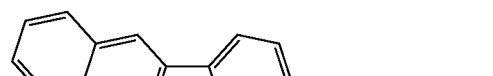

-continued

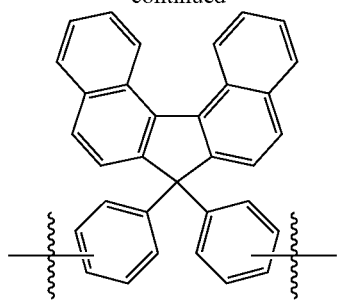

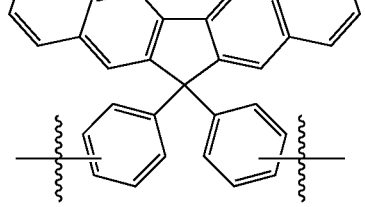

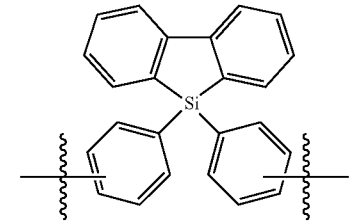

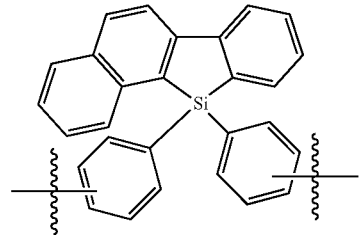

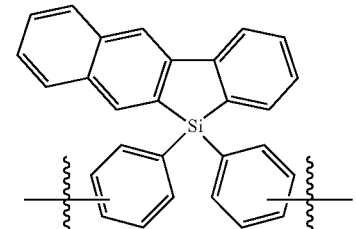

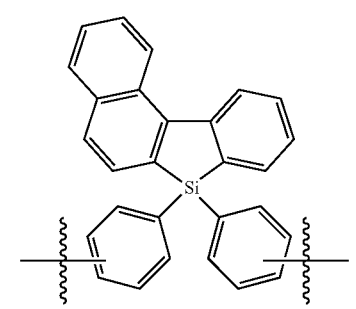

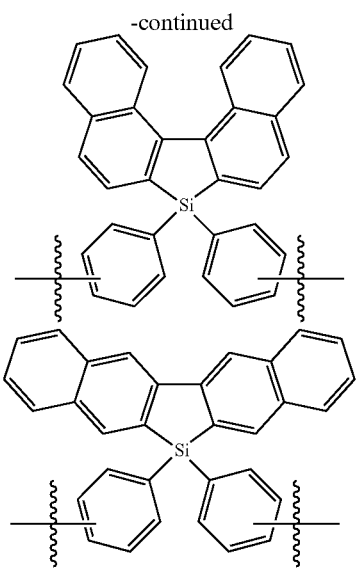

Specific examples of the above-mentioned Chemical Formulas (A) and (B) are as follows.

Chemical Formula (A)

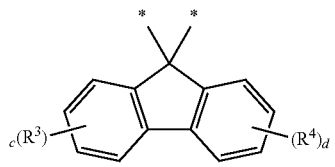

Chemical Formula (B)

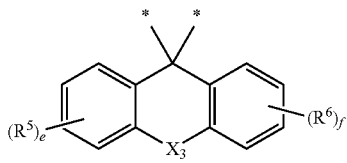

In Chemical Formulas (A) and (B) above,
11-1) * indicates a binding position,
11-2) $X_3$ is O, S, $SO_2$, or NR',
11-3) R' is hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_n$ aryloxy group; a fluorenyl group; a carbonyl group; an ether group; or a $C_1$-$C_{20}$ alkoxycarbonyl group,
11-4) $R^3$ to $R^6$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
11-5) $R^3$ to $R^6$ are each capable of forming a ring with an adjacent group, and
11-6) c to f are each independently an integer of 0 to 4.

Specific examples of the above-mentioned Chemical Formulas (C) and (D) are as follows.

Chemical Formula (C)

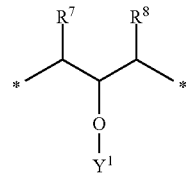

Chemical Formula (D)

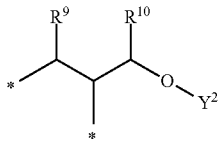

In Chemical Formulas (C) and (D) above,
12-1) * indicates a binding position,
12-2) $R^7$ to $R^{10}$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, and
12-3) $Y^1$ and $Y^2$ are Chemical Formula (E).

Specific examples of the above-mentioned Chemical Formula (E) and Chemical Formula (F) are as follows.

Chemical Formula (E)

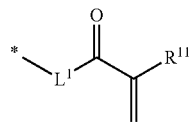

In Chemical Formula (E),
13-1) * indicates a binding position,
13-2) R'' is hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
13-3) $L^1$ is a single bond, $C_1$-$C_{30}$ alkylene, $C_6$-$C_{30}$ arylene, or $C_2$-$C_{30}$ heterocycle,
14) $R^1$ to $R^{11}$, R', R'', $X^1$ to $X^2$ and $L^1$, and a ring formed by bonding adjacent groups to each other may be each further substituted with one or more substituents selected from the group consisting of: deuterium; a halogen; a silane group substituted or unsubstituted with a $C_1$-$C_{30}$ alkyl group or a $C_6$-$C_{30}$ aryl group; a siloxane group; a boron group; a germanium group; a cyano group; an amino group; a nitro group; a $C_1$-$C_{30}$ alkylthio group; a $C_1$-$C_{30}$ alkoxy group; a $C_6$-$C_{30}$ arylalkoxy group; a $C_1$-$C_{30}$ alkyl group; a $C_2$-$C_{30}$ alkenyl group; a $C_2$-$C_{30}$ alkynyl group; a $C_6$-$C_{30}$ aryl group; a $C_6$-$C_{30}$ aryl group substituted with deuterium; a fluorenyl group; a $C_2$-$C_{30}$ heterocyclic group containing at least one heteroatom selected from the group consisting of O, N, S, Si, and P; a $C_3$-$C_{30}$ aliphatic cyclic group; a $C_7$-$C_{30}$ arylalkyl group; a $C_8$-$C_{30}$ arylalkenyl group; and combinations thereof, and adjacent substituents may form a ring.

When $R^1$ to $R^{11}$, R', R" and $X^1$ to $X^2$ are an aryl group, they may be preferably a $C_6$-$C_{30}$ aryl group, more preferably a $C_6$-$C_{18}$ aryl group, for example, phenyl, biphenyl, naphthyl, terphenyl, or the like.

When $R^1$ to $R^{11}$, R', R", $X^1$ to $X^2$, and $L^1$ are a heterocyclic group, they may be preferably a $C_2$-$C_{30}$ heterocyclic group, more preferably a $C_2$-Cis heterocyclic group, for example, dibenzofuran, dibenzothiophene, naphthobenzothiophene, naphthobenzofuran, or the like.

When $R^1$ to $R^{11}$, R', R", and $X^1$ to $X^2$ are a fluorenyl group, they may be preferably 9,9-dimethyl-9H-fluorene, 9,9-diphenyl-9H-fluorenyl group, 9,9'-spirobifluorene, or the like.

When $L^1$ is an arylene group, it may be preferably a $C_6$-$C_{30}$ arylene group, more preferably a $C_6$-$C_{18}$ arylene group, for example, phenyl, biphenyl, naphthyl, terphenyl, or the like.

When $R^1$ to $R^{11}$, R' and R" are an alkyl group, they may be preferably a $C_1$-$C_{10}$ alkyl group, for example, methyl, t-butyl, or the like.

When $R^1$ to $R^{11}$, R' and R" are an alkoxyl group, they may be preferably a $C_1$-$C_{20}$ alkoxyl group, more preferably a $C_1$-$C_{10}$ alkoxyl group, for example, methoxy, t-butoxy, or the like.

$R^1$ to $R^{11}$, R', R", $X^1$ to $X^2$, and a ring formed by bonding adjacent groups of $L^1$ to each other may be a $C_6$-$C_{60}$ aromatic cyclic group; a fluorenyl group; a $C_2$-$C_{60}$ heterocyclic group containing at least one heteroatom of O, N, S, Si, and P; or a $C_3$-$C_{60}$ aliphatic cyclic group, and for example, when adjacent groups are bonded to each other to form an aromatic ring, preferably a $C_6$-$C_{20}$ aromatic ring, more preferably a $C_6$-$C_{14}$ aromatic ring, for example, benzene, naphthalene, phenanthrene, or the like may be formed.

The resin according to the present disclosure may have a weight average molecular weight of 1,000 to 100,000 g/mol, preferably 1,000 to 50,000 g/mol, and more preferably 1,000 to 30,000 g/mol. When the weight average molecular weight of the resin is within the above range, a pattern may be well formed without a residue when the pattern layer is manufactured, there is no loss of film thickness during development, and a good pattern may be obtained.

The resin may be contained in an amount of 1 to 30% by weight, more preferably 3 to 20% by weight, with respect to the total amount of the photosensitive resin composition. When the resin is contained within the above range, excellent sensitivity, developability, and adherence (adhesion) may be obtained.

The photosensitive resin composition may further comprise an acrylic resin in addition to the resin. The acrylic resin, as a copolymer of a first ethylenically unsaturated monomer and a second ethylenically unsaturated monomer copolymerizable therewith, may be a resin containing one or more acrylic repeating units.

(B) Dye

A dye according to one embodiment of the present disclosure includes a structure shown in Chemical Formula (2) below.

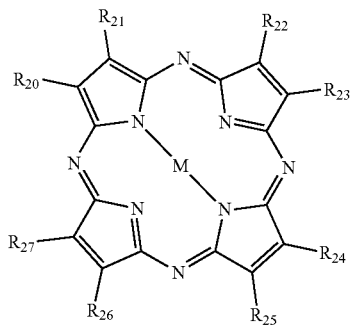

Chemical Formula (2)

In Chemical Formula (2), 15-1) M is Zn, Cu, Ti, Fe, V=O, Ni, Mn, or Co;

15-2) $R_{20}$ to $R_{27}$ are each independently hydrogen; deuterium; halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 15-3) $R_{20}$ to $R_{27}$ are each capable of forming a ring with an adjacent group, and 16) The rings formed by bonding $R_{20}$ to $R_{27}$ and neighboring groups to each other may be each further substituted with one or more substituents selected from the group consisting of: deuterium; halogen; a silane group substituted or unsubstituted with a $C_1$-$C_{30}$ alkyl group or a $C_6$-$C_{30}$ aryl group; a siloxane group; a boron group; a germanium group; a cyano group; an amino group; a nitro group; a $C_1$-$C_{30}$ alkylthio group; a $C_1$-$C_{30}$ alkoxy group; a $C_6$-$C_{30}$ arylalkoxy group; a $C_1$-$C_{30}$ alkyl group; a $C_2$-$C_{30}$ alkenyl group; a $C_2$-$C_{30}$ alkynyl group; a $C_6$-$C_{30}$ aryl group; a $C_6$-$C_{30}$ aryl group substituted with deuterium; a fluorenyl group; a $C_2$-$C_{30}$ heterocyclic group containing at least one heteroatom selected from the group consisting of O, N, S, Si, and P; a $C_3$-$C_{30}$ aliphatic ring; a $C_7$-$C_{30}$ arylalkyl group; a $C_8$-$C_{30}$ arylalkenyl group; and combinations thereof, and adjacent substituents may form a ring.

When $R_{20}$ to $R_{27}$ are an aryl group, they may be preferably a $C_6$-$C_{30}$ aryl group, more preferably a $C_6$-Cis aryl group, for example, phenyl, biphenyl, naphthyl, terphenyl, or the like.

When $R_{20}$ to $R_{27}$ are a heterocyclic group, they may be preferably a $C_2$-$C_{30}$ heterocyclic group, more preferably a $C_2$-$C_{18}$ heterocyclic group, for example, dibenzofuran, dibenzothiophene, naphthobenzothiophene, naphthobenzofuran, or the like.

When $R_{20}$ to $R_{27}$ are a fluorenyl group, they may be preferably 9,9-dimethyl-9H-fluorene, 9,9-diphenyl-9H-fluorenyl group, 9,9'-spirobifluorene, or the like.

When $R_{20}$ to $R_{27}$ are an alkyl group, they may be preferably a $C_1$-$C_{10}$ alkyl group, for example, methyl, t-butyl, or the like.

When $R_{20}$ to $R_{27}$ are an alkoxyl group, they may be preferably a $C_1$-$C_{20}$ alkoxyl group, more preferably a $C_1$-$C_{10}$ alkoxyl group, for example, methoxy, t-butoxy, or the like.

A ring formed by bonding adjacent groups of $R_{20}$ to $R_{27}$ to each other may be a $C_6$-$C_{60}$ aromatic cyclic group; a fluorenyl group; a $C_2$-$C_{60}$ heterocyclic group containing at least one heteroatom of O, N, S, Si, and P; or a $C_3$-$C_{60}$ aliphatic cyclic group, and for example, when adjacent groups are bonded to each other to form an aromatic ring, preferably a $C_6$-$C_{20}$ aromatic ring, more preferably a $C_6$-$C_{14}$ aromatic ring, for example, benzene, naphthalene, phenanthrene, or the like may be formed.

Since the dye having a porphyrazine structure as in Chemical Formula (2) above has high absorbance, it can have a high optical density even when a small amount is used, and can have a maximum absorbance at a narrow specific wavelength. Particularly, it has the advantage of being able to control the absorption wavelength through the transformation of the substituent and the central metal.

The dye can be mixed with one or more other colorants. The mixing ratio with other colorants can be used at a ratio of 1:99 to 99:1, preferably 3:97 to 97:3, and more preferably 10:90 to 90:10. When used within the above range, a desired optical density can be obtained, and it is also advantageous for pattern shaping.

Specific examples of the dye may include, as C.I. solvent dyes, yellow dyes such as C.I. Solvent Yellow 4, 14, 15, 16, 21, 23, 24, 38, 56, 62, 63, 68, 79, 82, 93, 94, 98, 99, 151, 162, 163, and the like; red dyes such as C.I. Solvent Red 8, 45, 49, 89, 111, 122, 125, 130, 132, 146, 179, and the like; orange dyes such as C.I. Solvent Orange 2, 7, 11, 15, 26, 41, 45, 56, 62, and the like; blue dyes such as C.I. Solvent Blue 5, 35, 36, 37, 44, 59, 67, 70, and the like; violet dyes such as C.I. Solvent Violet 8, 9, 13, 14, 36, 37, 47, 49, and the like; green dyes such as C.I. Solvent Green 1, 3, 4, 5, 7, 28, 29, 32, 33, 34, 35, and the like; etc.

Among the specific examples of the dye, C.I. Solvent Yellow 14, 16, 21, 56, 151, 79, and 93; C.I. Solvent Red 8, 49, 89, 111, 122, 132, 146, and 179; C.I. Solvent Orange 41, 45, and 62; C.I. Solvent Blue 35, 36, 44, 45, and 70; and C.I. Solvent Violet 13 which have excellent solubility in organic solvents among the C.I. solvent dyes are preferable. In particular, C.I. Solvent Yellow 21 and 79; C.I. Solvent Red 8, 122, and 132; and C.I. Solvent Orange 45 and 62 are more preferable.

Further, examples of a C.I. acid dye may include: yellow dyes such as C.I. Acid Yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, 251, and the like; red dyes such as C.I. Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422, 426, and the like; orange dyes such as C.I. Acid Orange 6, 7, 8, 10, 12, 26, 50, 51, 52, 56, 62, 63, 64, 74, 75, 94, 95, 107, 108, 169, 173, and the like; blue dyes such as C.I. Acid Blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, 340, and the like; violet dyes such as C.I. Acid Violet 6B, 7, 9, 17, 19, 66, and the like; green dyes such as C.I. Acid Green 1, 3, 5, 9, 16, 25, 27, 50, 58, 63, 65, 80, 104, 105, 106, 109, and the like; etc.

C.I. Acid Yellow 42; C.I. Acid Red 92; C.I. Acid Blue 80 and 90; C.I. Acid Violet 66; and C.I. Acid Green 27 which have excellent solubility in organic solvents among the acid dyes are preferable.

Further, examples of a C.I. direct dye may include: yellow dyes such as C.I. Direct Yellow 2, 33, 34, 35, 38, 39, 43, 47, 50, 54, 58, 68, 69, 70, 71, 86, 93, 94, 95, 98, 102, 108, 109, 129, 136, 138, 141, and the like; red dyes such as C.I. Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, 250, and the like; orange dyes such as C.I. Direct Orange 34, 39, 41, 46, 50, 52, 56, 57, 61, 64, 65, 68, 70, 96, 97, 106, 107, and the like; blue dyes such as C.I. Direct Blue 38, 44, 57, 70, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, 293, and the like; violet dyes such as C.I. Direct Violet 47, 52, 54, 59, 60, 65, 66, 79, 80, 81, 82, 84, 89, 90, 93, 95, 96, 103, 104, and the like; green dyes such as C.I. Direct Green 25, 27, 31, 32, 34, 37, 63, 65, 66, 67, 68, 69, 72, 77, 79, 82, and the like; etc.

Further, examples of a C.I. mordant dye may include: yellow dyes such as C.I. Mordant Yellow 5, 8, 10, 16, 20, 26, 30, 31, 33, 42, 43, 45, 56, 61, 62, 65, and the like; red dyes such as C.I. Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94, 95, and the like; orange dyes such as C.I. Mordant Orange 3, 4, 5, 8, 12, 13, 14, 20, 21, 23, 24, 28, 29, 32, 34, 35, 36, 37, 42, 43, 47, 48, and the like; blue dyes such as C.I. Mordant Blue 1, 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, 84, and the like; violet dyes such as C.I. Mordant Violet 1, 2, 4, 5, 7, 14, 22, 24, 30, 31, 32, 37, 40, 41, 44, 45, 47, 48, 53, 58, and the like; green dyes such as C.I. Mordant Green 1, 3, 4, 5, 10, 15, 19, 26, 29, 33, 34, 35, 41, 43, 53, and the like; etc.

In the present disclosure, the dyes may be each used alone or in combination of two or more.

The maximum absorption wavelength of the dye is preferably included in the wavelength region of 500 nm to 620 nm, more preferably 520 nm to 580 nm. When the maximum absorption wavelength of the dye is included within the above range, a display device using the photosensitive resin composition according to the present disclosure has a low reflectivity due to external visible light, and thus has improved visibility.

The dye may be contained in an amount of 0.1 to 10% by weight, more preferably 0.3 to 8% by weight, based on the total amount of the photosensitive resin composition. When the dye is contained within the above range, the curability and adhesion of the pattern are excellent, and the visibility of the display device can be improved by lowering the reflectivity at a wavelength of 550 nm.

(C) Pigment

The pigment may be one or more of an organic pigment and an inorganic pigment. A red pigment, a green pigment, a blue pigment, a yellow pigment, a black pigment, or the like may be used as the pigment.

Examples of the red pigment may include C.I. Pigment Red 254, C.I. Pigment Red 255, C.I. Pigment Red 264, C.I. Pigment Red 270, C.I. Pigment Red 272, C.I. Pigment Red 177, C.I. Pigment Red 89, etc.

Examples of the green pigment may include halogen-substituted copper phthalocyanine pigments such as C.I. Pigment Green 36, C.I. Pigment Green 7, and the like.

Examples of the blue pigment may include copper phthalocyanine pigments such as C.I. Pigment Blue 15:6, C.I.

Pigment Blue 15, C.I. Pigment Blue 15:1, C.I. Pigment Blue 15:2, C.I. Pigment Blue 15:3, C.I. Pigment Blue 15:4, C.I. Pigment Blue 15:5, C.I. Pigment Blue 16, and the like.

Examples of the yellow pigment may include isoindoline-based pigments such as C.I. Pigment Yellow 139 and the like, quinophthalone-based pigments such as C.I. Pigment Yellow 138 and the like, nickel complex pigments such as C.I. Pigment Yellow 150 and the like, etc.

Examples of the black pigment may include lactam black, aniline black, perylene black, titanium black, carbon black, and the like.

Although the pigments may be used alone or in combination of two or more, the present disclosure is not limited to these examples.

When high light shielding properties are required for a pattern layer formed of the photosensitive resin composition, the black pigment may be used in order to efficiently perform light shielding. When the black pigment is used, it may be used together with color correcting agents such as anthraquinone pigments, perylene pigments, phthalocyanine pigments, and azo pigments.

A dispersant may be used together in order to disperse the pigment in the photosensitive resin composition. The pigment may be used in a state that it is surface-treated in advance with a dispersant, or may be used by adding the dispersant together with the pigment when preparing the photosensitive resin composition.

The dispersant may include a nonionic dispersant, an anionic dispersant, a cationic dispersant, and the like. Specific examples of the dispersant may include polyalkylene glycol and its esters, polyoxyalkylene, polyhydric alcohol ester alkylene oxide adducts, alcohol alkylene oxide adducts, sulfonic acid esters, sulfonic acid salts, carboxylic acid esters, carboxylic acid salts, alkylamide alkylene oxide adducts, alkyl amines, and the like, and these may be used alone or in combination of two or more.

Examples of commercially available products of the dispersant may include: DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, etc. of BYK Corporation; EFKA-47, EFKA-47EA, EFKA-48, EFKA-49, EFKA-100, EFKA-400, EFKA-450, etc. of BASF Corporation; Solsperse 5000, Solsperse 12000, Solsperse 13240, Solsperse 13940, Solsperse 17000, Solsperse 20000, Solsperse 24000GR, Solsperse 27000, Solsperse 28000, etc. of Zeneka Corporation; and PB711, PB821, etc. of Ajinomoto Co., Inc.

The dispersant may be contained in an amount of 0.1 to 15% by weight with respect to the total amount of the photosensitive resin composition. When the dispersant is contained within the above range, the photosensitive resin composition is excellent in dispersibility, and is excellent in stability, developability, and patternability accordingly when manufacturing the light-shielding layer.

The pigment may be used after it is pretreated using a water-soluble inorganic salt and a wetting agent. When the pigment is used after it is pretreated as described above, the primary particle size of the pigment may be refined. The pretreatment may be performed by undergoing a step of kneading the pigment together with the water-soluble inorganic salt and the wetting agent and a step of filtering and washing the pigment obtained in the kneading step. The kneading may be performed at a temperature of 40 to 100° C., and the filtration and washing may be performed by washing the inorganic salt with water or the like and then filtering the washed inorganic salt. Although examples of the water-soluble inorganic salt may include sodium chloride, potassium chloride, and the like, the present disclosure is not limited thereto.

The wetting agent serves as a medium through which the pigment and the water-soluble inorganic salt are uniformly mixed and the pigment can be easily pulverized, and examples of the wetting agent may include: alkylene glycol monoalkyl ethers such as ethylene glycol monoethyl ether, propylene glycol monomethyl ether, diethylene glycol monomethyl ether, and the like; alcohols such as ethanol, isopropanol, butanol, hexanol, cyclohexanol, ethylene glycol, diethylene glycol, polyethylene glycol, glycerin, polyethylene glycol, and the like; etc., and these may be used alone or in combination of two or more.

The pigment that has undergone the kneading step may have an average particle diameter of 20 to 110 nm. When the average particle diameter of the pigment is within the above range, it is possible for the pigment to effectively form a pattern that is fine while having excellent heat resistance and light resistance.

The pigment may be contained in an amount of 1% by weight to 40% by weight, 1% by weight to 30% by weight, or 2% by weight to 30% by weight, based on the total amount of the photosensitive resin composition. When the pigment is contained within the above range, the photosensitive resin composition may form a pattern layer having excellent color reproducibility and excellent curability and adhesion.

The pigment and dye may be contained in an amount of 5 to 40% by weight, more specifically 8 to 30% by weight, based on the total amount of the photosensitive resin composition. When the pigment and dye are contained within the above range, the resolution, curability and adhesion of the pattern are excellent.

(D) Reactive Unsaturated Compound

The reactive unsaturated compound is (meth)acrylic acid having at least one ethylenically unsaturated double bond, and one or more monofunctional or polyfunctional esters may be used. The reactive unsaturated compound may be a monomer or an oligomer.

In the present specification, "(meth)acrylic acid" may refer to methacrylic acid, acrylic acid, or a mixture of methacrylic acid and acrylic acid.

The reactive unsaturated compound may be a photopolymerizable compound. Since the reactive unsaturated compound is a photopolymerizable compound, sufficient polymerization is possible when the photosensitive resin composition is exposed to light in the pattern forming process so that a pattern having excellent heat resistance, light resistance and chemical resistance may be formed.

Although examples of the reactive unsaturated compound may include one or more selected from ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol triacrylate, pentaerythritol tetraacrylate, dipentaerythritol pentaacrylate, dipentaerythritol hexaacrylate, bisphenol A epoxy acrylate, ethylene glycol monomethyl ether acrylate, trimethylolpropane triacrylate, and Tris[2-(acryloyloxy)ethyl] phosphate, the present disclosure is not limited thereto.

Examples of commercially available products of the reactive unsaturated compound are as follows.

Examples of the bifunctional ester of (meth)acrylic acid may include Aronix M-210, M-240, M-6200, etc. of Toagosei Chemical Industry Co., Ltd, KAYARAD HDDA, HX-220, R-604, etc. of Nippon Kayaku Co., Ltd, and V-260, V-312, V-335 HP, etc. of Osaka Organic Chemical Industry Ltd.

Examples of the trifunctional ester of (meth)acrylic acid may include Aronix M-309, M-400, M-405, M-450, M-7100, M-8030, and M-8060 of Toagosei Chemical Industry Co., Ltd, KAYARAD TMPTA, DPCA-20, DPCA-60, DPCA-120, etc. of Nippon Kayaku Co., Ltd, and V-295, V-300, V-360, etc. of Osaka Organic Chemical Industry Ltd.

The above products may be used alone or in combination of two or more.

The reactive unsaturated compound may be used after being treated with an acid anhydride in order to impart more excellent developability. The reactive unsaturated compound may be contained in an amount of 1 to 40% by weight, for example 1 to 20% by weight, with respect to the total amount of the photosensitive resin composition. When the reactive unsaturated compound is contained within the above range, curing occurs sufficiently during exposure to light in the pattern forming process so that it is excellent in reliability, is excellent in heat resistance, light resistance, and chemical resistance of the pattern, and is also excellent in resolution and adhesion.

(E) Photoinitiator

A photopolymerization initiator, a radical polymerization initiator, or a combination thereof may be used as the initiator.

The photopolymerization initiator may include, for example, one or more of an acetophenone-based compound, a benzophenone-based compound, a thioxanthone-based compound, a benzoin-based compound, an oxime-based compound, and a triazine-based compound.

Examples of the acetophenone-based compound may include 2,2'-diethoxy acetophenone, 2,2'-dibutoxy acetophenone, 2-hydroxy-2-methylpropiophenone, p-t-butyltrichloroacetophenone, p-t-butyldichloroacetophenone, 4-chloroacetophenone, 2,2-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butane-1-one, etc.

Examples of the benzophenone-based compound may include benzophenone, benzoyl benzoic acid, methyl benzoyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-(dimethylamino)benzophenone, 4,4'-dichlorobenzophenone, 3,3'-dimethyl-2-methoxybenzophenone, etc.

Examples of the thioxanthone-based compound may include thioxanthone, 2-crolthioxanthone, 2-methylthioxanthone, isopropyl thioxanthone, 2,4-diethyl thioxanthone, 2,4-diisopropylthioxanthone, 2-chlorothioxanthone, etc.

Examples of the benzoin-based compound may include benzoin, benzoin methyl ether, benzoin ethyl ether, benzoin isopropyl ether, benzoin isobutyl ether, benzyldimethyl ketal, etc.

Examples of the oxime-based compound may include 2-(o-benzoyloxime)-1-[4-(phenylthio)phenyl]-1,2-octanedione, 1-(o-acetyloxime)-1-[9-ethyl-6-(2-methylbenzoyl)-9H-carbazol-3-yl]ethanone, O-ethoxycarbonyl-α-oxyamino-1-phenylpropan-1-one, 2-dimethylamino-2-(4-methylbenzyl)-1-(4-morpholin-4-yl-phenyl)-butan-1-one, 1-(4-phenylsulfanyl phenyl)-butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-one oxime-O-acetate, 1-(4-phenylsulfanyl phenyl)-butan-1-one oxime-O-acetate, 1-(4-methylsulfanyl-phenyl)-butan-1-one oxime-O-acetate, hydroxyimino-(4-methylsulfanyl-phenyl)-acetic acid ethyl ester-O-acetate, hydroxyimino-(4-methylsulfanyl-phenyl)-acetic acid ethyl ester-O-benzoate, etc.

Examples of the triazine-based compound may include 2,4,6-trichloro-s-triazine, 2-phenyl-4,6-bis(trichloromethyl)-s-triazine, 2-(3',4'-Dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2-4-trichloromethyl-(piperonyl)-6-triazine, 2-4-trichloromethyl(4'-methoxystyryl)-6-triazine, etc.

The photopolymerization initiator may include a carbazole-based compound, a diketone-based compound, a sulfonium borate-based compound, a diazo-based compound, an imidazole-based compound, a biimidazole-based compound, etc. in addition to the above-mentioned compounds.

The radical polymerization initiator may include a peroxide-based compound, an azobis-based compound, or the like.

Examples of the peroxide-based compound may include: ketone peroxides such as methyl ethyl ketone peroxide, methyl isobutyl ketone peroxide, cyclohexanone peroxide, methyl cyclohexanone peroxide, acetylacetone peroxide, and the like; diacyl peroxides such as isobutyryl peroxide, 2,4-dichlorobenzoyl peroxide, o-methylbenzoyl peroxide, bis-3,5,5-trimethylhexanoyl peroxide, and the like; hydroperoxides such as 2,4,4,-trimethylpentyl-2-hydroperoxide, diisopropyl benzene hydroperoxide, cumene hydroperoxide, t-butyl hydroperoxide, and the like; dialkyl peroxides such as dicumyl peroxide, 2,5-dimethyl-2,5-di(tert-butylperoxy)hexane, 1,3-bis(tert-butyloxyisopropyl)benzene, t-butylperoxy valeric acid n-butyl ester, and the like; alkyl peresters such as 2,4,4-trimethylpentyl peroxyphenoxyacetate, α-cumyl peroxyneodecanoate, t-butyl peroxybenzoate, di-t-butyl peroxytrimethyl adipate, and the like; percarbonates such as di-3-methoxybutyl peroxy dicarbonate, di-2-ethylhexyl peroxydicarbonate, bis-4-t-butylcyclohexyl peroxydicarbonate, diisopropyl peroxydicarbonate, acetyl cyclohexyl sulfonyl peroxide, t-butyl peroxyarylcarbonate, and the like; etc.

Examples of the azobis-based compound may include 1,1'-azobiscyclohexane-1-carbonitrile, 2,2'-azobis(2,4-dimethylvaleronitrile), 2,2,-azobis(methylisobutyrate), 2,2'-azobis(4-methoxy-2,4-dimethylvaleronitrile), α,α'-azobis(isobutylnitrile), 4,4'-azobis(4-cyanovaleic acid), etc.

The initiator may be used together with a photosensitizer that causes a chemical reaction by absorbing light to become an excited state and then transferring its energy. Examples of the photosensitizer may include tetraethylene glycol bis(3-mercaptopropionate), pentaerythritol tetrakis(3-mercaptopropionate), dipentaerythritol tetrakis(3-mercaptopropionate), and the like.

The initiator may be contained in an amount of 0.01 to 10% by weight, or 0.1 to 5% by weight, with respect to the total amount of the photosensitive resin composition. When the initiator is contained within the above range, curing occurs sufficiently during exposure to light in the pattern forming process using the photosensitive resin composition so that excellent reliability may be obtained, the pattern is not only excellent in heat resistance, light resistance, and chemical resistance, but also excellent in resolution and adhesion, and a decrease in transmittance due to an unreacted initiator may be prevented.

(F) Solvent

As the solvent, materials that have compatibility with the binder resin, the reactive unsaturated compound, the pigment, and the initiator, but are not reacted therewith may be used.

Examples of the solvent may include: alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethyl ether, ethylene glycol monoethyl ether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethyl ether, diethylene glycol monoethyl ether, diethylene glycol dimethyl ether, diethylene glycol methyl ethyl ether, diethylene glycol diethyl ether, and the like; propylene glycol alkyl ether acetates such as propylene glycol methyl ether acetate, propylene glycol propyl ether acetate, and the like; aromatic hydrocarbons such as toluene, xylene, and the like; ketones such as methyl ethyl ketone, cyclohexanone, 4-hydroxy-4-methyl-2-pentanone, methyl-n-propyl ketone, methyl-n-butyl ketone, methyl-n-amyl ketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxyacetic acid alkyl esters such as methyl oxyacetate, ethyl oxyacetate, butyl oxyacetate, and the like; alkoxy acetate alkyl esters such as methoxy methyl acetate, methoxy ethyl acetate, methoxy butyl acetate, ethoxy methyl acetate, ethoxy ethyl acetate, and the like; 3-oxypropionic acid alkyl esters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxypropionic acid alkyl esters such as methyl 2-oxypropionate, ethyl 2-oxypropionate, propyl 2-oxypropionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such as 2-oxy-2-methyl methyl propionate, 2-oxy-2-methyl ethyl propionate, and the like; monooxy monocarboxylic acid alkyl esters of 2-alkoxy-2-methyl propionic acid alkyls such as 2-methoxy-2-methyl methyl propionate, 2-ethoxy-2-methyl ethyl propionate, and the like; esters such as 2-hydroxyethyl propionate, 2-hydroxy-2-methyl ethyl propionate, ethyl hydroxyacetate, 2-hydroxy-3-methyl methyl butanoate, and the like; ketonic acid esters such as ethyl pyruvate and the like; etc.

Further, examples of the solvent may also include high-boiling point solvents such as N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like.

Among the solvents, glycol ethers such as ethylene glycol monoethyl ether and the like; ethylene glycol alkyl ether acetates such as ethyl cellosolve acetate and the like; esters such as ethyl 2-hydroxypropionate and the like; carbitols such as diethylene glycol monomethyl ether and the like; and propylene glycol alkyl ether acetates such as propylene glycol methyl ether acetate, propylene glycol propyl ether acetate, etc. may be used by considering compatibility and reactivity.

The solvent may be contained in a balance amount with respect to the total amount of the photosensitive resin composition, and specifically may be contained in an amount of 50 to 90% by weight. When the solvent is contained within the above range, as the photosensitive resin composition has an appropriate viscosity, processability is excellent when manufacturing the pattern layer.

Further, an additional embodiment of the present disclosure may provide a display device.

The display device according to the embodiment of the present disclosure includes a pattern layer containing a polymerization reaction product of the photosensitive resin composition.

In a display device according to embodiments of the present disclosure, matters about the photosensitive resin composition will be omitted since the matters are the same as those of the above-described photosensitive resin composition according to the embodiments of the present disclosure.

The polymerization reaction product of the photosensitive resin composition may be formed by, for example, processes of applying the photosensitive resin composition to a TFT substrate and curing the applied photosensitive resin composition.

The pattern layer may have excellent resolution and a high taper angle by containing the polymerization reaction product of the photosensitive resin composition.

The display device may include a plurality of sub-pixels, and the pattern layer may be a pixel defining layer that separates the plurality of sub-pixels.

For example, a light emitting device may be positioned in a sub-pixel of the display device, and the light emitting device may be an organic light emitting device. The organic light emitting device may have, for example, a first electrode, an organic layer, and a second electrode which are sequentially stacked therein. In this example, the pattern layer may be positioned on the first electrode, and the pattern layer may have an opening portion on the first electrode. The organic layer may be positioned in the opening portion and on the first electrode, and the second electrode may be positioned on the organic layer. Since the light emitting area of the sub-pixel is determined by an opening region of such a pattern layer, the above-described pattern layer may be a pixel defining layer.

Further, the pattern layer is preferable as a light-shielding layer that shields light.

A pattern layer according to one embodiment of the present disclosure may have a high taper angle. For example, the pattern layer according to the embodiment of the present disclosure may have an inclination angle of 20 to 40 degrees. The inclination angle may be an inclination angle with respect to a direction parallel to the display surface at a point where the inclination starts.

The pattern layer, which is the above-described pixel defining layer, has an opening portion, and an inclined portion connecting the opening portion and the non-opening portion has an inclination angle.

The pattern layer according to one embodiment of the present disclosure contains a polymerization reaction product of the above-described photosensitive resin composition. The above-described photosensitive resin composition may form a pattern layer without a residue, and since a melting flow has been suppressed in the pattern forming process, a high inclination angle may be implemented.

Accordingly, since the pattern layer having a high inclination angle may reduce the length of the inclined portion, the distance between the opening portions is reduced so that sub-pixels may be densely disposed, and the display device may have high resolution.

Hereinafter, Synthesis Examples and Examples according to the present disclosure will be specifically described, but Synthesis Examples and Examples of the present disclosure are not limited thereto.

Synthesis Example 1

(Preparation of Compound 1-1)

After putting 20 g of 9,9'-bisphenol fluorene (Sigma-Aldrich), 8.67 g of glycidyl chloride (Sigma-Aldrich), 30 g of potassium carbonate anhydrous, and 100 ml of dimethylformamide into a 300 ml 3-neck round bottom flask having a distillation tube installed therein, raising the temperature of the flask to 80° C. and reacting the materials for 4 hours to obtain a reaction solution, lowering the temperature of the flask to 25° C. and filtering the reaction solution to obtain a filtrate, adding the filtrate dropwise to water while stirring 1000 ml of water, thereby obtaining a precipitated powder, and filtering the precipitated powder to obtain a resulting material, a compound 1-1 (25 g) could be obtained by washing the resulting material with water and drying the washed resulting material under reduced pressure at 40° C. The obtained powder showed a purity of 98% as a result of purity analysis by HPLC.

<Compound 1-1>

Synthesis Example 2

(Preparation of Compounds 2-1 to 2-3)

After putting 25 g (54 mmol) of the compound 1-1 obtained in Synthesis Example 1, 8 g of acrylic acid (Daejung Chemical & Metals Co., Ltd), 0.2 g of benzyltriethylammonium chloride (Daejung Chemical & Metals Co., Ltd), 0.2 g of hydroquinone (Daejung Chemical & Metals Co., Ltd), and 52 g of toluene (Sigma-Aldrich) into a 300 ml 3-neck round bottom flask having a distillation tube installed therein, the materials were stirred at 110° C. for 6 hours. After completing the reaction, toluene was removed by distillation under reduced pressure to obtain a product. After filling 500 g of silica gel 60 (230-400 meshes, Merck & Co., Inc) in a glass column with a diameter of 220 mm, compounds 2-1 to 2-3 were separated by filling 20 g of the product in the glass column and performing separation using 10 L of a solvent in which hexane and ethyl acetate had been mixed at a volume ratio of 4:1.

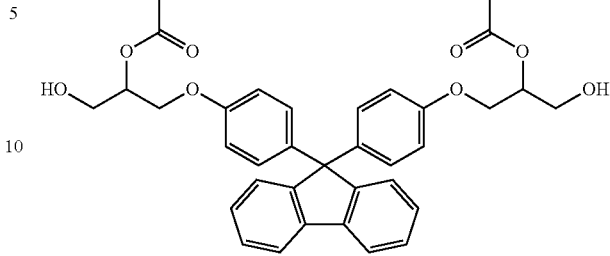

<Compound 2-1>

<Compound 2-2>

<Compound 2-3>

Synthesis Examples 3 to 9

(Manufacturing of Polymers 1 to 7)

After putting the compound 2-1, compound 2-2, and compound 2-3 obtained in Synthesis Example 2 into a 50 ml 3-neck round bottom flask having a distillation tube installed therein respectively as shown in Table 1 below, injecting 0.1 g of tatraethylammonium bromide (Daejung Chemical & Metals Co., Ltd), 0.03 g of hydroquinone (Daejung Chemical & Metals Co., Ltd), and 8.05 g of propylene glycol methyl ether acetate (Sigma-Aldrich) into the 50 ml 3-neck round bottom flask having the distillation tube installed therein, and additionally injecting 1.22 g of Biphenyltetracarboxylic Dianhydride (Mitsubishi Gas Chemical Company, Inc) and 0.38 g of tetrahydrophthalic acid (Sigma-Aldrich) into the flask, the materials were stirred at 110° C. for 6 hours. After completing the reaction to obtain a reaction solution, polymers 1 to 7 having repeating units such as the compounds 2-1, 2-2, and 2-3 mixed therein could be obtained in the form of a solution containing 45% solids by recovering the reaction solution. The synthesized polymers were analyzed for weight average molecular weight (MW) using gel permeation chromatography (Agilent Technologies, Inc).

TABLE 1

| | Synthesis Example 3 (Polymer 1) | Synthesis Example 4 (Polymer 2) | Synthesis Example 5 (Polymer 3) | Synthesis Example 6 (Polymer 4) | Synthesis Example 7 (Polymer 5) | Synthesis Example 8 (Polymer 6) | Synthesis Example 9 (Polymer 7) |
|---|---|---|---|---|---|---|---|
| Compound 2-1 | 3 g | 1 g | 1 g | 4.25 g | 0.25 g | 5 g | 0 g |
| Compound 2-2 | 1 g | 3 g | 1 g | 0.25 g | 4.25 g | 0 g | 5 g |
| Compound 2-3 | 1 g | 1 g | 3 g | 0.5 g | 0.5 g | 0 g | 0 g |
| $M_w$ | 4,800 g/mol | 4,200 g/mol | 4,600 g/mol | 4,400 g/mol | 4,100 g/mol | 5,200 g/mol | 3,300 g/mol |

Synthesis Example 10

(Preparation of Compound 3-1)

17 g of (Z)-3,4-dicyano-3-hexene (Hongkong Chemhere Co., Ltd.), 10 g of 1,8-Diazabicyclo[5,4,0]-7-undecene (Aldrich), 5 g of vanadium trichloride (Aldrich), and 100 ml of n-pentanol (Aldrich) were put in a 200 ml 3-neck round bottom flask having a distillation tube installed therein, the temperature was raised to 120° C., and the mixture was stirred for 18 hours. N-pentanol was all removed by distillation under reduced pressure, 100 ml of methanol (Aldrich) was inputted, and then the mixture was stirred for 30 minutes and filtered under reduced pressure to obtain a blue solid. 11 g of Compound 3-1 was obtained through a silica gel column chromatography purification method.

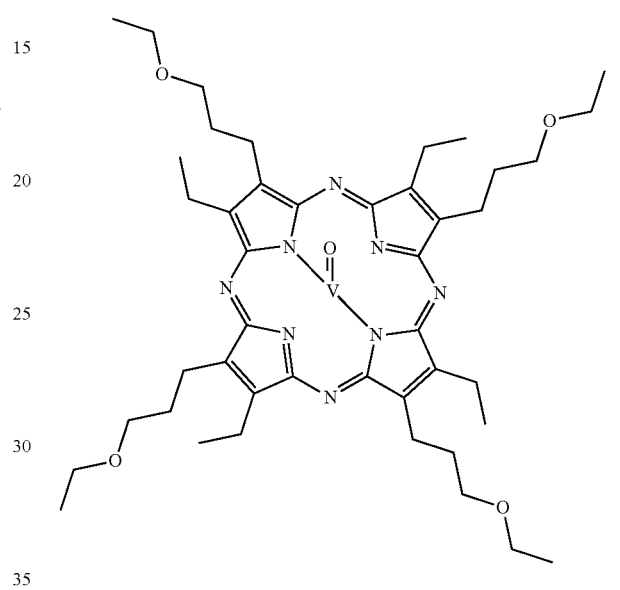

<Compound 3-2>

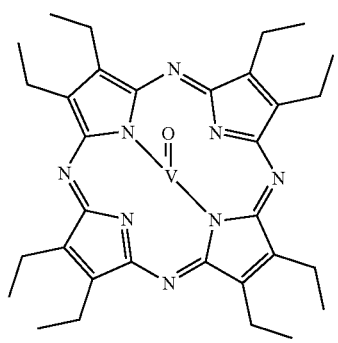

<Compound 3-1>

Synthesis Example 11

(Preparation of Compound 3-2)

13.4 g of Compound 3-2 was obtained by performing synthesis in the same manner as in Synthesis Example 10 except that 24.4 g of (Z)-2-(3-ethoxypropyl)-3-ethyl-2-butenedinitrile (Shanghai Chemical Product List) was used instead of 17 g of (Z)-3,4-dicyano-3-hexene (Hongkong Chemhere Co., Ltd.) in Synthesis Example 10 above.

Synthesis Example 12

(Preparation of Compound 3-3)

13.4 g of Compound 3-3 was obtained by performing synthesis in the same manner as in Synthesis Example 10 except that 4.1 g of nickel dichloride (Aldrich) was used instead of 5 g of vanadium trichloride (Aldrich) in Synthesis Example 10 above.

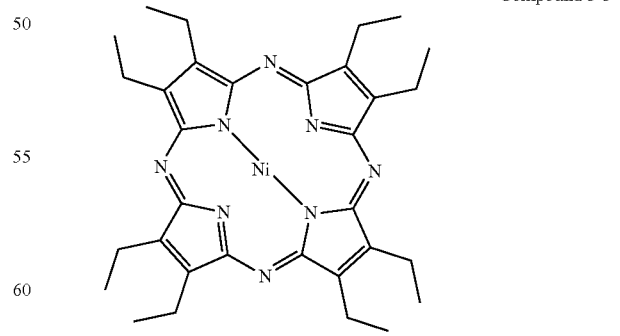

<Compound 3-3>

The maximum absorption wavelengths of Compound 3-1 to Compound 3-3 synthesized in Synthesis Example 10 to Synthesis Example 12 are as shown in Table 2 below.

TABLE 2

| | Compound 3-1 | Compound 3-2 | Compound 3-3 |
|---|---|---|---|
| Absorption $\lambda_{max}$ (nm) | 590 | 594 | 585 |

Synthesis Example 13

(Manufacture of Acrylic Binder)

After 34.2 g of styrene (Aldrich), 10.8 g of methacrylic acid (Aldrich), 9 g of phenylmaleimide (TCI), 6 g of methyl methacrylate (Aldrich), and 6 g of 2,2'-azobis(2,4-dimethylvaleronitrile) (initiator) together with propylene glycol monomethyl ether acetate were inputted in a 300 mL flask with a cooling tube and a stirrer, the temperature was raised to 80° C., and the mixture was stirred for 4 hours so that Compound 4-1 having a weight average molecular weight of 11,000 could be obtained as a solution with a solid content of 30%.

Preparation Example 1

(Preparation of Black Pigment Dispersion)

A dispersion could be obtained by dispersing 15 g of Irgaphor Black S 100 CF (black pigment/BASF), 8.5 g of Disperbyk 163 (BYK), and 6.5 g of SR-3613 (SMS) together with 70 g of propylene glycol methyl ether acetate and 100 g of zirconia beads having a diameter of 0.5 mm (Toray) for 10 hours using a paint shaker (Asada).

Examples 1 to 7

Photosensitive composition solutions were prepared with the compositions as in Table 3 below.

TABLE 3

| | Example 1 | Example 2 | Example 3 | Example 4 | Example 5 | Example 6 | Example 7 |
|---|---|---|---|---|---|---|---|
| Black pigment dispersion of Preparation Example 1 | 30 | 30 | 30 | 30 | 30 | 30 | 30 |
| Miraemer M600 (Miwon Specialty Chemical) | 3.5 | 3.5 | 3.5 | 3.5 | 3.5 | 3.5 | 3.5 |
| OXE-02 (BASF) | 0.5 | 0.5 | 0.5 | 0.5 | 0.5 | 0.5 | 0.5 |
| Compound 3-1 | 0.5 | — | — | 0.5 | 0.5 | 0.5 | 0.5 |
| Compound 3-2 | — | 0.5 | — | — | — | — | — |
| Compound 3-3 | — | — | 0.5 | — | — | — | — |
| Polymer 1 | — | — | — | 8 | — | — | — |
| Polymer 2 | — | — | — | — | 8 | — | — |
| Polymer 3 | 8 | 8 | 8 | — | — | — | — |
| Polymer 4 | — | — | — | — | — | 8 | — |
| Polymer 5 | — | — | — | — | — | — | 8 |
| Polymer 6 | — | — | — | — | — | — | — |
| Polymer 7 | — | — | — | — | — | — | — |
| Compound 4-1 | — | — | — | — | — | — | — |
| Propylene glycol methyl ether acetate (Daicel) | 57.5 | 57.5 | 57.5 | 57.5 | 57.5 | 57.5 | 57.5 |

Comparative Examples 1 to 4

Photosensitive composition solutions were prepared with the compositions as in Table 4 below.

TABLE 4

| | Comparative Example 1 | Comparative Example 2 | Comparative Example 3 | Comparative Example 4 | Comparative Example 5 |
|---|---|---|---|---|---|
| Black pigment dispersion of Preparation Example 1 | 30 | 30 | 30 | 34 | 30 |
| Miraemer M600 (Miwon Specialty Chemical) | 3.5 | 3.5 | 3.5 | 3.5 | 3.5 |
| OXE-02 (BASF) | 0.5 | 0.5 | 0.5 | 0.5 | 0.5 |
| Compound 3-1 | — | 0.5 | 0.5 | — | 0.5 |
| Compound 3-2 | — | — | — | — | — |
| Compound 3-3 | — | — | — | — | — |
| Polymer 1 | — | — | — | — | — |
| Polymer 2 | 8 | — | — | 8 | — |
| Polymer 3 | — | — | — | — | — |
| Polymer 4 | — | — | — | — | — |
| Polymer 5 | — | — | — | — | — |
| Polymer 6 | — | 8 | — | — | — |
| Polymer 7 | — | — | 8 | — | — |
| Compound 4-1 | — | — | — | — | 8 |
| Propylene glycol methyl ether acetate (Daicel) | 58 | 57.5 | 57.5 | 54 | 54 |

A method for manufacturing a light-shielding layer using the composition solutions according to Table 3 and Table 4 is as follows.

(1) Applying and Coating Film Forming Step

After applying the above-described black photosensitive resin compositions to a thickness of 1.5 m onto a washed 10 cm*10 cm glass substrate using a spin coater, coating films were formed by heating the applied black photosensitive resin compositions at a temperature of 100° C. for 1 minute, thereby removing a solvent therefrom.

(2) Exposure Step

After interposing a mask with a predetermined shape in order to form a pattern required for the obtained coating films, actinic rays of 190 to 500 nm were irradiated on the mask-interposed coating films. MA-6 was used as an exposure machine, and the actinic rays were irradiated in an exposure amount of 100 mJ/cm².

(3) Development Step

Following the exposure step, after developing the coating films by a method of dipping the exposed coating films in an AX 300 MIF developer of AZ Electronic Materials (AZEM) at 25° C. for 1 minute, image patterns were formed by washing the developed coating films with water, dissolving and removing unexposed portions of the washed developed coating films, thereby leaving only exposed portions of the washed developed coating films.

(4) Post-Processing Step

In order to obtain excellent patterns in terms of heat resistance, light resistance, close adhesion properties, crack resistance, chemical resistance, high strength, storage stability, etc., the image patterns obtained by the development were post-baked in an oven at 230° C. for 30 minutes.

After measuring the reflectivities of the patterns thus obtained and the maximum resolutions (minimum size patterns on the substrate) of the patterns formed on the substrate, the measurement results are shown in Tables 5 and 6.

TABLE 5

|  | Example 1 | Example 2 | Example 3 | Example 4 | Example 5 | Example 6 | Example 7 |
|---|---|---|---|---|---|---|---|
| Minimum size pattern (μm) | 5.7 | 5.7 | 5.8 | 5.9 | 6.0 | 6.1 | 6.2 |
| Optical density/μm (@550 nm) | 1.3 | 1.3 | 1.4 | 1.3 | 1.3 | 1.4 | 1.3 |
| Reflectivity (%, @550 nm) | 5.2 | 5.5 | 4.9 | 5.3 | 5.4 | 5.2 | 5.3 |
| Transmittance (%, @365 nm) | 11.6 | 12.3 | 12.2 | 11.8 | 11.8 | 11.7 | 11.7 |

TABLE 6

|  | Comparative Example 1 | Comparative Example 2 | Comparative Example 3 | Comparative Example 4 | Comparative Example 5 |
|---|---|---|---|---|---|
| Minimum size pattern (μm) | 6.1 | 9.7 | 9.8 | 8.4 | 12.5 |
| Optical density/μm (@550 nm) | 0.8 | 1.0 | 1.0 | 1.2 | 1.0 |
| Reflectivity (%, @550 nm) | 9.8 | 6.6 | 6.4 | 8.5 | 7.1 |
| Transmittance (%, @365 nm) | 11.6 | 11.7 | 11.9 | 6.1 | 11.5 |

As shown in Tables 5 and 6, it was confirmed that the reflectivities at a wavelength of 550 nm in Examples 1 to 7 and Comparative Examples 2 and 3 using the dye of Synthesis Examples 10 to 12 were lower than Comparative Examples 1 and 4 without using the dye. Accordingly, the patterns formed of the photosensitive resin compositions to which the dye was added had lower reflectivities than the patterns formed of the photosensitive resin compositions to which the dye was not added, and it could be seen that the visibility could be improved when applying this to a display.

Further, in the case of Examples 1 to 7 using the dye of the present disclosure, decrease of the transmittance in the 365 nm region was affected insignificantly so that it could be confirmed that, compared to Comparative Example 1 using the same % by weight of the black pigment dispersion, the transmittance and resolution were maintained at similar levels, the optical densities were increased, and the reflectivities were lowered.

Meanwhile, in the case of Comparative Example 4 in which the ratio of the black pigment dispersion was increased without using the dye of the present disclosure, the reflectivity was lowered compared to Comparative Example 1, but it could be seen that the transmittance in the 365 nm region was greatly lowered so that the photoinitiator did not sufficiently receive energy from the light source to lower the degree of polymerization, and the minimum size pattern was formed large so that the resolution was lowered.

In the case of Polymer 6 or Polymer 7 used in Comparative Example 2 or Comparative Example 3, it is formed by polymerizing one type of monomer and has a relatively linear shape compared to Polymers 1 to 5 depending on the structure of the monomer. Meanwhile, in the case of Polymers 1 to 5 used in Examples 1 to 7, they are polymerized with three types of monomers each having a different structure so that they have a relatively net-type structure compared to Polymers 6 and 7. Accordingly, in the case of Examples 1 to 7 in which patterns were formed using Polymers 1 to 5, since the dye was well adsorbed even after undergoing the exposure step and the development step, it could be confirmed that they had higher optical densities and lower reflectivities than those of Comparative Examples 2 and 3 using Polymers 6 and 7 having a relatively linear structure.

Further, comparing the minimum size patterns of Examples 1 to 7 using the resins of Polymers 1 to 5 and Comparative Examples 2 and 3 using Polymers 6 and 7, it can be seen that patterns of 5.7 to 6.2 μm are implemented in the case of Examples 1 to 7. It is determined from this that Polymers 1 to 5 used in Examples 1 to 7 effectively form intermolecular bonds with surrounding compounds due to their structural characteristics so that they are structures more suitable for the photolithography process, and accordingly, show higher resolution during the development process.

Meanwhile, in the case of Polymers 6 and 7 used in Comparative Examples 2 and 3, it was confirmed that they had a relatively straight line structure compared to Polymers 1 to 5, and the minimum size patterns were implemented from 9.7 or 9.8 μm, and the resolution was relatively low.

When the acrylic binder is used together with the dye of the present disclosure instead of an alkali-soluble resin of the present disclosure as in Comparative Example 5 in Table 6 above, it showed the lowest resolution due to the structure of the polymer chain and side branches and the resulting difference in characteristics compared to the alkali-soluble resin of the present disclosure.

The above description is merely for exemplarily explaining the present disclosure, and those skilled in the art to which the present disclosure pertains will be able to allow various modifications to be made within a range that does not depart from the essential characteristics of the present disclosure.

Accordingly, the embodiments disclosed in the present specification are not intended to limit the present disclosure, but to explain the present disclosure, and the spirit and scope of the present disclosure are not limited by these embodiments. The protection scope of the present disclosure should be construed by the claims, and all technologies within the scope equivalent thereto should be construed as being included in the right scope of the present disclosure.

INDUSTRIAL APPLICABILITY

The present disclosure provides a photosensitive resin composition comprising a resin containing a repeating unit represented by Chemical Formula (1), a dye represented by Chemical Formula (2), a reactive unsaturated compound, a pigment, an initiator, and a solvent, and a display device including a pattern layer containing a polymerization reaction product of the photosensitive resin composition.

The invention claimed is:
1. A photosensitive resin composition comprising:
a binder resin containing a repeating unit represented by the following Chemical Formula (1);
a dye represented by the following Chemical Formula (2);
a pigment;
a reactive unsaturated compound;
a photoinitiator; and
a solvent:

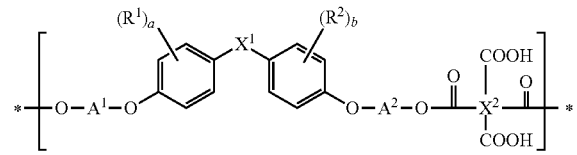

Chemical Formula (1)

In Chemical Formula (1),
1) * indicates a part where bonds are connected as a repeating unit,
2) $R^1$ and $R^2$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group,
3) $R^1$ and $R^2$ are each capable of forming a ring with an adjacent group,
4) A and b are each independently an integer of 0 to 4,
5) $X^1$ is a single bond, O, CO, $SO_2$, CR'R", SIR'R", Chemical Formula (A), or Chemical Formula (B),
6) $X^2$ is a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; or combinations thereof, 7) R' and R" are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 8) R' and R" are each capable of forming a ring with an adjacent group, 9) $A^1$ and $A^2$ are each independently Chemical Formula (C) or Chemical Formula (D), 10) The ratio of Chemical Formula (C) to Chemical Formula (D) within the polymer chain of the resin containing the repeating unit represented by Chemical Formula (1) satisfies 1:9 to 9:1,

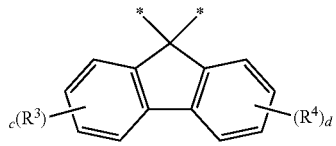

Chemical Formula (A)

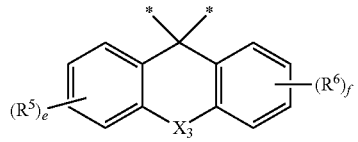

Chemical Formula (B)

In Chemical Formulas (A) and (B), 11-1) * indicates a binding position, 11-2) $X_3$ is O, S, $SO_2$, or NR', 11-3) R' is hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 11-4) $R^3$ to $R^6$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic ring and aromatic ring; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 11-5) $R^3$ to $R^6$ are each capable of forming a ring with an adjacent group, and 11-6) c to f are each independently an integer of 0 to 4,

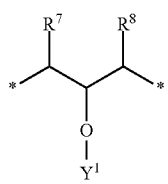

Chemical Formula (C)

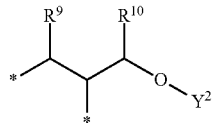

Chemical Formula (D)

In Chemical Formulas (C) and (D), 12-1) * indicates a binding position, 12-2) $R^7$ to $R^{10}$ are each independently hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, and 12-3) $Y^1$ and $Y^2$ are Chemical Formula (E),

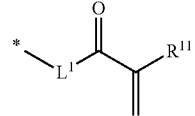

Chemical Formula (E)

In Chemical Formula (E), 13-1) * indicates a binding position, 13-2) $R^{11}$ is hydrogen; deuterium; a halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 13-3) $L^1$ is a single bond, $C_1$-$C_{30}$ alkylene, $C_6$-$C_{30}$ arylene, or $C_2$-$C_{30}$ heterocycle, 14) $R^1$ to $R^{11}$, R', R", $X^1$ to $X^2$ and $L^1$, and a ring formed by bonding adjacent groups to each other are each further substituted with one or more substituents selected from the group consisting of: deuterium; a halogen; a silane group substituted or unsubstituted with a $C_1$-$C_{30}$ alkyl group or a $C_6$-$C_{30}$ aryl group; a siloxane group; a boron group; a germanium group; a cyano group; an amino group; a nitro group; a $C_1$-$C_{30}$ alkylthio group; a $C_1$-$C_{30}$ alkoxy group; a $C_6$-$C_{30}$ arylalkoxy group; a $C_1$-$C_{30}$ alkyl group; a $C_2$-$C_{30}$ alkenyl group; a $C_2$-$C_{30}$ alkynyl group; a $C_6$-$C_{30}$ aryl group; a $C_6$-$C_{30}$ aryl group substituted with deuterium; a fluorenyl group; a $C_2$-$C_{30}$ heterocyclic group containing at least one heteroatom selected from the group consisting of O, N, S, Si, and P; a $C_3$-$C_{30}$ aliphatic cyclic group; a $C_7$-$C_{30}$ arylalkyl group; a $C_8$-$C_{30}$ arylalkenyl group; and combinations thereof, and adjacent substituents form a ring,

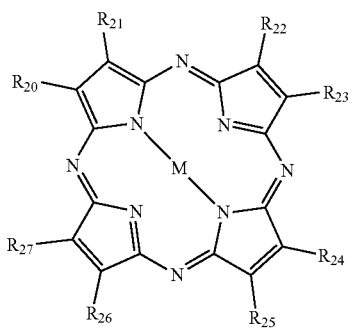

Chemical Formula (2)

In Chemical Formula (2), 15-1) M is Zn, Cu, Ti, Fe, V=O, Ni, Mn, or Co;

15-2) $R_{20}$ to $R_{27}$ are each independently hydrogen; deuterium; halogen; a $C_6$-$C_{30}$ aryl group; a $C_2$-$C_{30}$ heterocyclic group containing at least one heteroatom of O, N, S, Si, and P; a fused ring group of $C_6$-$C_{30}$ aliphatic and aromatic rings; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_6$-$C_{30}$ aryloxy group; a fluorenyl group; a carbonyl group; an ether group; or a $C_1$-$C_{20}$ alkoxycarbonyl group, 15-3) $R_{20}$ to $R_{27}$ are each capable of forming a ring with an adjacent group, and 16) the rings formed by bonding $R_{20}$ to $R_{27}$ and neighboring groups to each other are each further substituted with one or more substituents selected from the group consisting of: deuterium; halogen; a silane group substituted or unsubstituted with a $C_1$-$C_{30}$ alkyl group or a $C_6$-$C_{30}$ aryl group; a siloxane group; a boron group; a germanium group; a cyano group; an amino group; a nitro group; a $C_1$-$C_{30}$ alkylthio group; a $C_1$-$C_{30}$ alkoxy group; a $C_6$-$C_{30}$ arylalkoxy group; a $C_1$-$C_{30}$ alkyl group; a $C_2$-$C_{30}$ alkenyl group; a $C_2$-$C_{30}$ alkynyl group; a $C_6$-$C_{30}$ aryl group; a $C_6$-$C_{30}$ aryl group substituted with deuterium; a fluorenyl group; a $C_2$-$C_{30}$ heterocyclic group containing at least one heteroatom selected from the group consisting of O, N, S, Si, and P; a $C_3$-$C_{30}$ aliphatic ring; a $C_7$-$C_{30}$ arylalkyl group; a $C_8$-$C_{30}$ arylalkenyl group; and combinations thereof, and adjacent substituents form a ring.

2. The photosensitive resin composition of claim 1, wherein $X^1$ of Chemical Formula 1 above is Chemical Formula (A) or Chemical Formula (B).

3. The photosensitive resin composition of claim 2, wherein $X^1$ of Chemical Formula 1 is Chemical Formula (A).

4. The photosensitive resin composition of claim 1, wherein the maximum absorption wavelength of the dye represented by Chemical Formula (2) above is included in a region of 500 nm to 620 nm.

5. The photosensitive resin composition of claim 1, wherein the cured film formed of the photosensitive resin composition has an optical density of 1 or more per 1 μm of film thickness at a wavelength of 550 nm and a reflectivity of 9% or less per 1 μm of film thickness at a wavelength of 550 nm.

6. The photosensitive resin composition of claim 1, wherein the binder resin containing a repeating unit represented by Chemical Formula (1) above has a weight average molecular weight of 1,000 to 50,000 g/mol.

7. The photosensitive resin composition of claim 1, comprising:
   1 to 30% by weight of the resin containing the repeating unit represented by Chemical Formula (1) above;
   0.1 to 10% by weight of the dye represented by Chemical Formula (2) above;
   1 to 30% by weight of the pigment;
   1 to 40% by weight of the reactive unsaturated compound;
   0.01 to 10% by weight of the photoinitiator; and
   the balance of the solvent.

8. A pattern layer containing a polymerization reaction product of the photosensitive resin composition of claim 1.

9. The pattern layer of claim 8, wherein the pattern layer is a light-shielding layer.

10. A display device comprising the pattern layer of claim 9.

11. The pattern layer of claim 8, wherein the pattern layer is a pixel defining layer that separates a plurality of sub-pixels.

12. The pattern layer of claim 11, wherein the sub-pixels include a light-emitting device therein.

13. A display device comprising the pattern layer of claim 12.

14. The pattern layer of claim 11 wherein the sub-pixels include an organic light-emitting device therein.

15. A display device comprising the pattern layer of claim 14.

16. A display device comprising the pattern layer of claim 11.

17. A display device comprising the pattern layer of claim 8.

18. An electronic device comprising the display device of claim 17 and a controller for driving the display device.

* * * * *